(12) United States Patent
Kokatsu

(10) Patent No.: US 11,228,286 B2
(45) Date of Patent: Jan. 18, 2022

(54) LINEAR AMPLIFIER

(71) Applicant: THINE ELECTRONICS, INC., Tokyo (JP)

(72) Inventor: Hideyuki Kokatsu, Tokyo (JP)

(73) Assignee: THINE ELECTRONICS, INC., Tokyo (JP)

(\*) Notice: Subject to any disclaimer, the term of this patent is extended or adjusted under 35 U.S.C. 154(b) by 0 days.

(21) Appl. No.: 17/060,508

(22) Filed: Oct. 1, 2020

(65) Prior Publication Data
US 2021/0104980 A1    Apr. 8, 2021

(30) Foreign Application Priority Data

Oct. 4, 2019 (JP) .............................. JP2019-183869

(51) Int. Cl.
*H03F 1/32* (2006.01)
*H03F 1/42* (2006.01)
*H03F 3/45* (2006.01)

(52) U.S. Cl.
CPC ............. *H03F 1/3211* (2013.01); *H03F 1/42* (2013.01); *H03F 3/45076* (2013.01); *H03F 2200/36* (2013.01)

(58) Field of Classification Search
CPC ...... H03F 1/3211; H03F 1/42; H03F 3/45076; H03F 2200/36; H03F 2203/45488; H03F 3/45098; H03F 3/4508; H03F 3/45; H03F 1/32; H03F 1/52; H03F 2203/45008; H03F 2203/45012; H03H 7/38

USPC .................................................. 330/252–261
See application file for complete search history.

(56) References Cited

U.S. PATENT DOCUMENTS 8,798,204 B2\* 8/2014 Chen ................... H04L 25/0276
   375/316
8,854,125 B2\* 10/2014 Ikeda .................. H03F 3/45475
   330/69

OTHER PUBLICATIONS

"Multirate Clock and Data Recovery with Limiting Amplifier", Maxim Integrated Products, MAX3872 data sheet, Rev. 3, 2007, p. 1-p. 15 (15 Pages total).

\* cited by examiner

*Primary Examiner* — Hieu P Nguyen
(74) *Attorney, Agent, or Firm* — Sughrue Mion, PLLC

(57) ABSTRACT

A linear amplifier outputs differential signals corresponding to differential signals input to a first signal input terminal and a second signal input terminal, and includes a first resistor, a second resistor, a third resistor, a fourth resistor, a first capacitor, a second capacitor, a third transistor, a fourth transistor, a differential amplifier, and a signal processing circuit. The signal processing circuit includes a first transistor and a second transistor, and includes a resistor as a common voltage output part that outputs a common voltage. The differential amplifier receives the common voltage and a reference voltage, and applies a voltage corresponding to the voltage difference between the common voltage and the reference voltage to the control terminals of the transistors.

10 Claims, 8 Drawing Sheets

LINEAR AMPLIFIER

TECHNICAL FIELD

The present invention relates to a linear amplifier.

BACKGROUND

A linear amplifier is provided for the purpose of extending the transmission distance of differential communication and is used for recovery of transmission loss and the like. A circuit example of the linear amplifier is shown on page 11 of Non Patent Literature 1 (Maxim Integrated, Multirate Clock and Data Recovery with Limiting Amplifier MAX3872 data sheet, Rev. 3, 2007).

Depending on the application, the linear amplifier may be required to have high linearity of the amplitude of the output differential signals with respect to the amplitude of the input differential signals, and may be required to have a constant gain over a wide band.

SUMMARY

For example, linear amplifiers used in USB3.1 Gen2, USB4, and the like are required to have high linearity and have a constant gain over a wide band. However, known linear amplifiers cannot meet the demands for these applications.

The present linear amplifier has a high linearity and a constant gain over a wide band to solve the aforementioned problem.

The present linear amplifier outputs differential signals corresponding to differential signals input to a first signal input terminal and a second signal input terminal, and comprises (1) a signal processing circuit including a first transistor and a second transistor, each of which has a first terminal, a second terminal, and a control terminal, and a common voltage output part that, when differential signals are input to the control terminals of the first transistor and the second transistor, outputs a common voltage of the differential signals at a stage later than the first terminal or the second terminal of each of the first transistor and the second transistor; (2) a first resistor provided between the first signal input terminal and a first reference potential terminal; (3) a second resistor provided between the second signal input terminal and the first reference potential terminal; (4) a third resistor provided between the first signal input terminal and the control terminal of the first transistor; (5) a fourth resistor provided between the second signal input terminal and the control terminal of the second transistor; (6) a first capacitor provided in parallel with the third resistor; (7) a second capacitor provided in parallel with the fourth resistor; (8) a third transistor including: a first terminal, a second terminal, and a control terminal, the third transistor being provided between the control terminal of the first transistor and a second reference potential terminal through the first terminal and the second terminal of the third transistor, respectively; (9) a fourth transistor including: a first terminal, a second terminal, and a control terminal, the fourth transistor being provided between the control terminal of the second transistor and the second reference potential terminal through the first terminal and the second terminal of the fourth transistor, respectively; and (10) a differential amplifier that receives the common voltage and a reference voltage and applies a voltage corresponding to a voltage difference between the common voltage and the reference voltage to the control terminals of the third transistor and the fourth transistor.

The linear amplifier of the invention can have high linearity and have a constant gain over a wide band.

DESCRIPTION OF EMBODIMENTS

Figure 1:
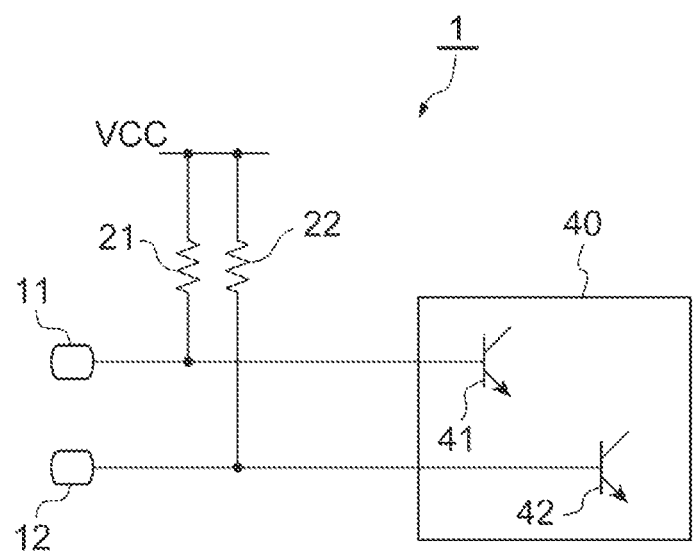
FIG. 1 is a diagram illustrating the configuration of a linear amplifier 1 of a first comparative example.

Hereinafter, embodiments for carrying out the invention will be described in detail with reference to the accompanying diagrams. In addition, in the description of the diagrams, the same elements are denoted by the same reference numerals, and the repeated description thereof will be omitted. The invention is not limited to these examples, but is defined by the claims, and is intended to include all modifications within the scope and meaning equivalent to the claims.

Hereinafter, the configuration and problems of a linear amplifier of a comparative example will be described first, and then the configuration of a linear amplifier of an embodiment will be described.

FIG. 1 is a diagram illustrating the configuration of a linear amplifier 1 of a first comparative example. The linear amplifier 1 illustrated in this diagram is used in a differential signal transmission system. The linear amplifier 1 outputs output differential signals corresponding to input differential signals input to signal input terminals 11 and 12, and includes resistors 21 and 22 and a signal processing circuit 40.

The signal processing circuit 40 includes transistors 41 and 42 at the input stage. The transistors 41 and 42 are NPN bipolar transistors. The resistor 21 is provided between a signal input terminal 11 and a power source potential terminal (VCC). The resistor 22 is provided between the signal input terminal 12 and the power source potential terminal. The power source potential terminal supplies a power source potential VCC. The resistors 21 and 22 are provided as terminating resistors and have a resistance value of 50Ω, for example. The base of the transistor 41 is connected to the signal input terminal 11. The base of the transistor 42 is connected to the signal input terminal 12.

in the linear amplifier 1, a base current is supplied from the power source potential terminal to the bases of the transistors 41 and 42 through the resistors 21 and 22, so that the transistors 41 and 42 operate. The emitters of the transistors 41 and 42 operate at a voltage lower than the base voltage by a base-emitter voltage $V_{BE}$ (for example, about 0.8 V). The collectors of the transistors 41 and 42 are connected to, for example, the power source potential terminal. The differential signals input to the signal input terminals 11 and 12 are input to the bases of the transistors 41 and 42 and output from the emitters of the transistors 41 and 42.

As will be described below, the linear amplifier 1 has a limit in improving linearity. Therefore, the linear amplifier 1 has a problem when used in a differential signal transmission system that requires high linearity, such as USB3.1 Gen2 and USB4. The emitter voltages of the transistors 41 and 42 change in conjunction with the base voltage, whereas the collector voltages of the transistors 41 and 42 are fixed to the power source potential VCC. Therefore, a collector-emitter voltage $V_{CE}$ decreases as the base voltage increases. When large-amplitude (for example, 0.5 V or more) differential signals are input to the bases of the transistors 41 and 42, $V_{CE}$ becomes 0.3 V or less and approaches the saturation region, so that a current gain $h_{FE}$ decreases abruptly. A decrease in $h_{FE}$ means a decrease in gain. Therefore, the waveforms of the output differential signals are distorted and the linearity is lost when the input differential signals have large amplitudes.

This is not a big problem in systems up to USB3.0 Gen 1. However, in systems of USB3.1 Gen2 and later that are faster and more sophisticated, a high degree of linearity in the communication waveform is required. For example, in the compliance test of USB3.1 Gen2, it is required to transmit a signal without changing the waveform of a predetermined test pattern (for example, without changing the overshoot waveform and the amplitude of less than 1 Vpp). The linear amplifier 1 of the first comparative example cannot meet such a demand.

Figure 2:
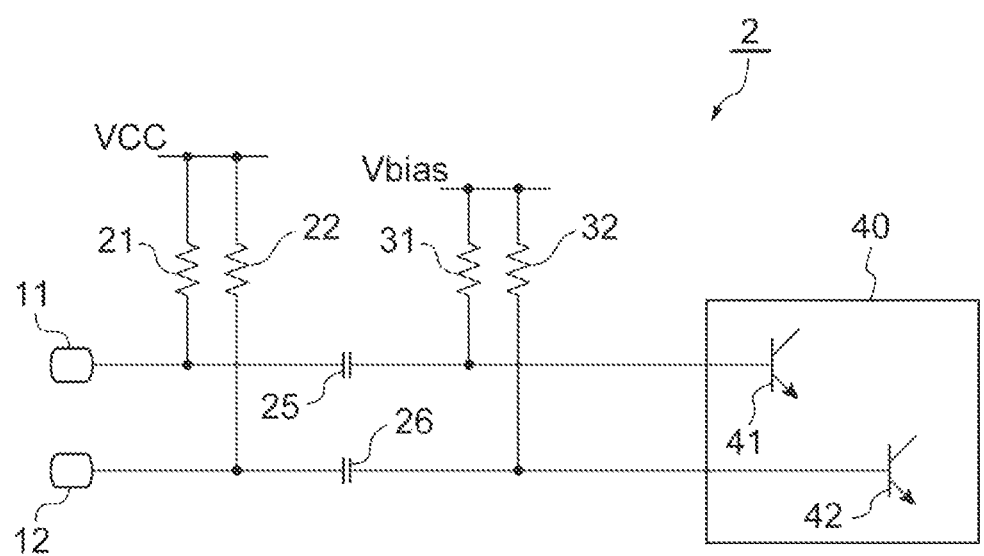
FIG. 2 is a diagram illustrating the configuration of a linear amplifier 2 of a second comparative example.

FIG. 2 is a diagram illustrating the configuration of a linear amplifier 2 of a second comparative example. The linear amplifier 2 of the second comparative example illustrated in FIG. 2 is different from the configuration of the linear amplifier 1 of the first comparative example illustrated in FIG. 1 in that capacitors 25 and 26 and resistors 31 and 32 are further provided.

The capacitor 25 is provided between the signal input terminal 11 and the base of the transistor 41. The capacitor 26 is provided between the signal input terminal 12 and the base of the transistor 42. The resistor 31 is provided between the base of the transistor 41 and the bias potential terminal. The resistor 32 is provided between the base of the transistor 42 and the bias potential terminal. The bias potential terminal supplies a bias potential Vbias lower than the power source potential VCC. The difference between the power source potential VCC and the bias potential Vbias is, for example, about 0.8 V.

In the linear amplifier 2, the resistors 21 and 22 are used as terminating resistors, while a base current is supplied from the bias potential terminal to the bases of the transistors 41 and 42 through the resistors 31 and 32, so that the transistors 41 and 42 operate. The differential signals input to the signal input terminals 11 and 12 are input to the bases of the transistors 41 and 42 through the capacitors 25 and 26, and are output from the emitters of the transistors 41 and 42.

By applying the bias potential Vbias lower than the power source potential VCC to the bases of the transistors 41 and 42, the linear amplifier 2 of the second comparative example can solve the problem of low linearity that the linear amplifier 1 of the first comparative example has.

However, in the linear amplifier 2 of the second comparative example, the capacitors 25 and 26 and the resistors 31 and 32 form a high frequency band filter, and the high frequency band filter attenuates low frequency band components of the input differential signals. In general, as the followability of low frequency components, it is required that the signal loss is 3 dB or less at a frequency of 100 kHz. If NPN bipolar transistors having a relatively low impedance are used as the transistors 41 and 42, the resistance values of the resistors 31 and 32 should be values of several kΩ or less in order to suppress a voltage drop due to the base current, and the capacitance values of the capacitors 25 and 26 need to be 1 nF or more. It is difficult to fit the capacitors having such large capacitance values in the IC chip. Therefore, it is practically difficult to adopt the linear amplifier 2 of the second comparative example.

Linear amplifiers of embodiments described below with reference to FIGS. 3 and 4 can solve the above problems of the linear amplifiers 1 and 2 of the comparative examples, and can have high linearity and a constant gain over a wide band.

The linear amplifier of the present embodiment outputs output differential signals corresponding to input differential signals input to the first signal input terminal 11 and the second signal input terminal 12, and includes a first resistor 21, a second resistor 22, a third resistor 23, a fourth resistor 24, a first capacitor 25, a second capacitor 26, a third transistor 27, a fourth transistor 28, a differential amplifier 29, and a signal processing circuit 50.

The signal processing circuit 50 includes a first transistor 51 and a second transistor 52, and also includes a resistor 53 as a common voltage output part that outputs a common voltage. Each of the transistors 51 and 52 has a first terminal, a second terminal, and a control terminal. Differential signals are input to the control terminals of the transistors 51 and 52. The resistor 53 as a common voltage output part outputs a common voltage of the differential signals at a stage later than the first terminal or the second terminal of each of the transistors 51 and 52. The resistor 53 is provided between a pair of signal lines for transmitting differential signals. For example, a voltage at the midpoint of the resistor 53 is output as the common voltage. An appropriate position present between both ends of the resistor 53 is set as a node for the common voltage.

The resistor 21 is provided between the signal input terminal 11 and a first reference potential terminal (for example, potential VCC). The resistor 22 is provided between the signal input terminal 12 and the first reference potential terminal (for example, potential VCC). The resistor 23 is provided between the signal input terminal 11 and the control terminal of the transistor 51. The resistor 24 is provided between the signal input terminal 12 and the control terminal of the transistor 52. The capacitor 25 is provided in parallel with the resistor 23. The capacitor 26 is provided in parallel with the resistor 24.

Each of the transistors 27 and 28 has a first terminal, a second terminal, and a control terminal. The transistor 27 is provided between the control terminal of the transistor 51 and the second reference potential terminal (for example, ground potential) through the first terminal and the second terminal. The transistor 28 is provided between the control terminal of the transistor 52 and the second reference potential terminal (for example, ground potential) through the first terminal and the second terminal. The differential amplifier 29 receives the common voltage and a reference voltage VREF, and applies a voltage corresponding to the voltage difference therebetween to the control terminals of the transistors 27 and 28. The reference voltage VREF may be applied from the outside. In addition, the linear amplifier may include a reference voltage generator that outputs the reference voltage VREF.

One of the first reference potential terminal and the second reference potential terminal is a power source potential terminal, and the other is a ground potential terminal. The transistors 51 and 52 are of the same type, and may be any of an NPN bipolar transistor, a PNP bipolar transistor, an NMOS transistor, and a PMOS transistor. The transistors 27 and 28 are of the same type, and may be any of an NPN bipolar transistor, a PNP bipolar transistor, an NMOS transistor and a PMOS transistor. The transistors 51 and 52 and the transistors 27 and 28 may be of the same type or of different types.

In the case of a bipolar transistor, one of the first terminal and the second terminal is a collector, the other is an emitter, and the control terminal is a base. In the case of a MOS transistor (field effect transistor), one of the first terminal and the second terminal is a source, the other is a drain, and the control terminal is a gate.

The resistors 21 and 22 have the same resistance value. The resistors 23 and 24 have the same resistance value. The capacitors 25 and 26 have the same capacitance value. The resistance value (R2) of each of the resistors 23 and 24 is larger than the resistance value (R1) of each of the resistors 21 and 22 (R1<R2). For example, the resistance value of each of the resistors 21 and 22 is 50Ω, and the resistance value of each of the resistors 23 and 24 is several kΩ.

Figure 3:
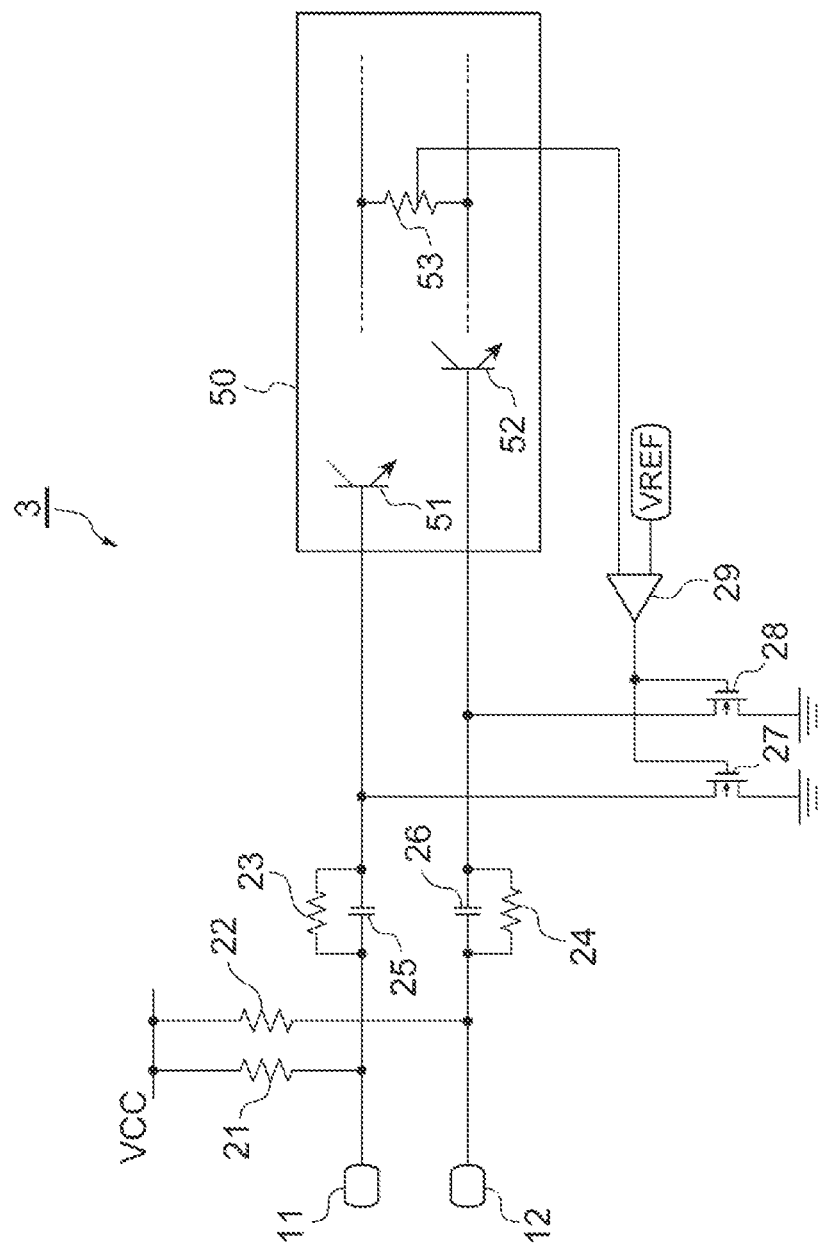
FIG. 3 is a diagram illustrating the configuration of a linear amplifier 3 of a first embodiment.

FIG. 3 is a diagram illustrating the configuration of a linear amplifier 3 of a first embodiment. In the configuration of the first embodiment, the first reference potential terminal to which the resistors 21 and 22 are connected is the power source potential terminal (VCC), the second reference potential terminal to which the transistors 27 and 28 are connected is the ground potential terminal, the transistors 51 and 52 are NPN bipolar transistors, and the transistors 27 and 28 are NMOS transistors.

In the linear amplifier 3, the resistors 21 and 22 are used as terminating resistors. The resistors 23 and 24 and the capacitors 25 and 26 isolate the signal input terminals 11 and 12 from the bases of the transistors 51 and 52. The base voltage of each of the transistors 51 and 52 depends on the magnitude of the current flowing from the power source potential terminal to the ground potential terminal through the resistors 21 and 22, the resistors 23 and 24, and the transistors 27 and 28. The differential amplifier 29 receives the common voltage and the reference voltage VREF output from the midpoint of the resistor 53 and applies a voltage corresponding to the voltage difference therebetween to the control terminals of the transistors 27 and 28, thereby controlling the current flowing through the transistors 27 and 28.

Due to such common mode feedback, a current flows through the transistors 27 and 28 so that the common voltage at the midpoint of the resistor 53 becomes equal to the reference voltage VREF. Therefore, since an appropriate voltage lower than the power source potential VCC is applied to the bases of the transistors 51 and 52, it is possible to have high linearity. In addition, it is possible to have a constant gain over a wide band.

Common mode feedback works on in-phase signals but does not work on differential signals. Therefore, the transistors 27 and 28 have high impedance and do not cause loss. As a result, even if the capacitance values of the capacitors 25 and 26 are about several pF, low frequency band components of the input differential signals are also transmitted without being attenuated, so that the capacitors 25 and 26 can be fit into the IC chip.

Figure 4:
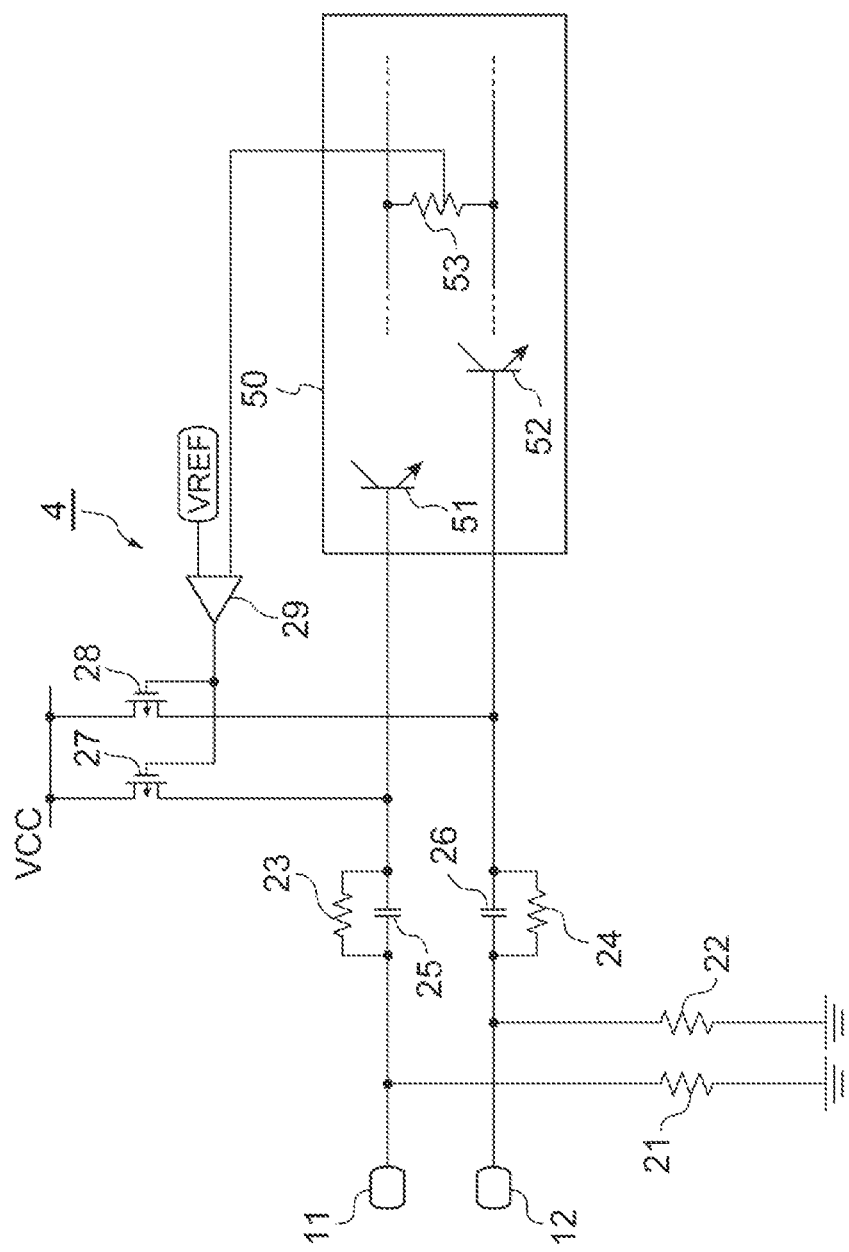
FIG. 4 is a diagram illustrating the configuration of a linear amplifier 4 of a second embodiment.

FIG. 4 is a diagram illustrating the configuration of a linear amplifier 4 of a second embodiment. In the configuration of the second embodiment, the first reference potential terminal to which the resistors 21 and 22 are connected is the ground potential terminal, the second reference potential terminal to which the transistors 27 and 28 are connected is the power source potential terminal (VCC), the transistors 51 and 52 are NPN bipolar transistors, and the transistors 27 and 28 are PMOS transistors. The linear amplifier 4 of the second embodiment operates in the same manner as the linear amplifier 3 of the first embodiment, and has the same effect.

Next, a configuration example of the signal processing circuit 50 will be described with reference to FIGS. 5 to 7. Each of signal processing circuits 50A to 50C in these configuration examples can output output differential signals corresponding to input differential signals from signal output terminals 13 and 14.

Figure 5:
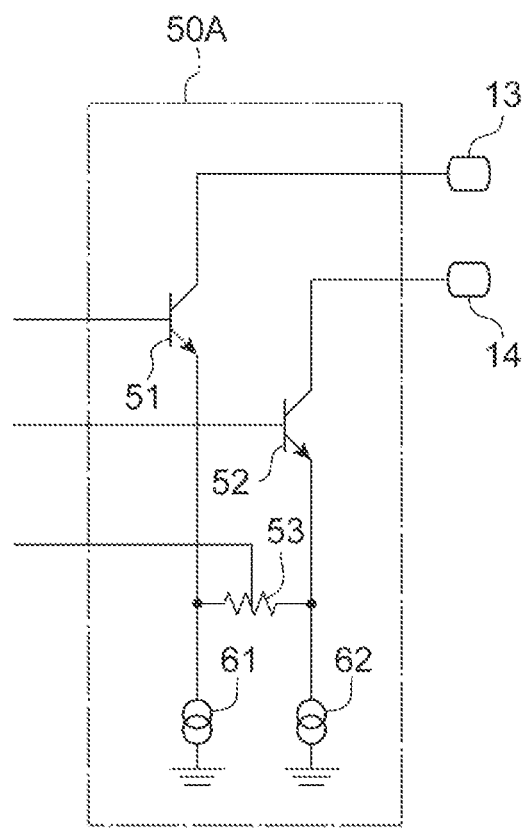
FIG. 5 is a diagram illustrating a first configuration example of a signal processing circuit 50.

FIG. 5 is a diagram illustrating a first configuration example of the signal processing circuit 50. The signal processing circuit 50A illustrated in the diagram includes current sources 61 and 62 in addition to the transistors 51 and 52 and the resistor 53. The transistors 51 and 52 are NPN bipolar transistors. The current sources 61 and 62 flow currents of the same magnitude. The collector of the transistor 51 is connected to the signal output terminal 13. The collector of the transistor 52 is connected to the signal output terminal 14. The emitter of the transistor 51 is connected to the ground potential terminal through the current source 61. The emitter of the transistor 52 is connected to the ground potential terminal through the current source 62. The resistor 53 is provided between the emitters of the transistors 51 and 52.

Figure 6:
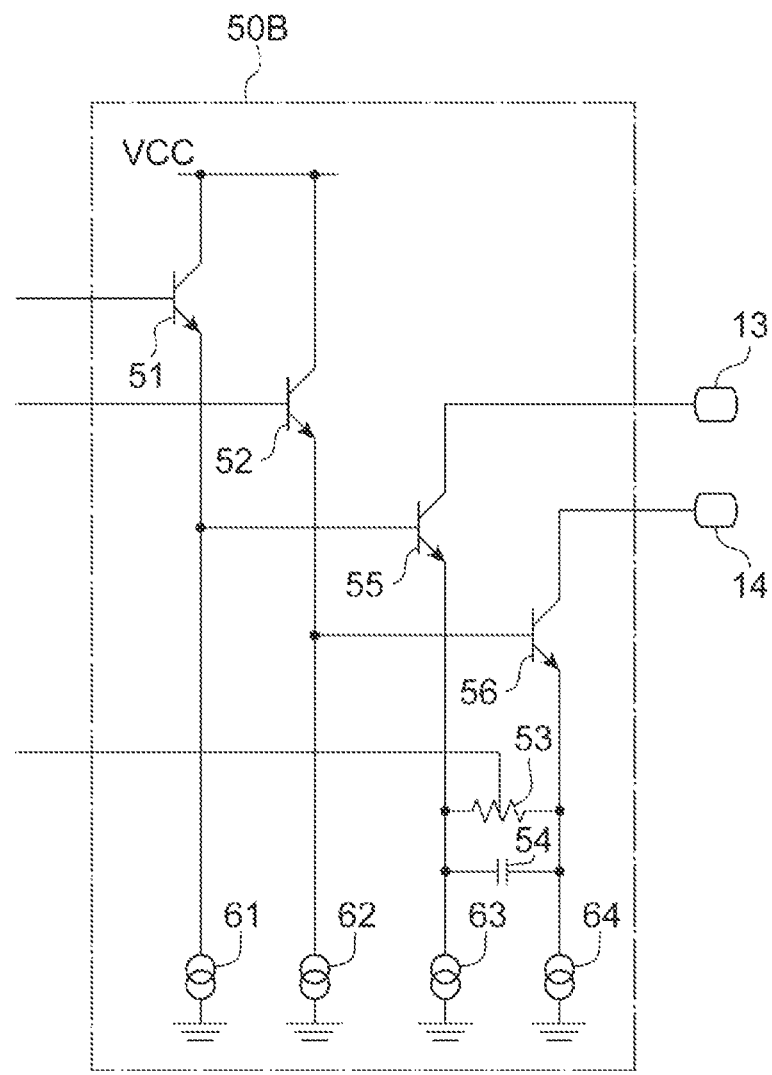
FIG. 6 is a diagram illustrating a second configuration example of the signal processing circuit 50.

FIG. 6 is a diagram illustrating a second configuration example of the signal processing circuit 50. The signal processing circuit 50B illustrated in the diagram includes a capacitor 54, transistors 55 and 56, and current sources 61 to 64 in addition to the transistors 51 and 52 and the resistor 53. The transistors 51, 52, 55, and 56 are NPN bipolar transistors. The current sources 61 to 64 flow currents of the same magnitude. The collectors of the transistors 51 and 52 are connected to the power source potential terminal. The collector of the transistor 55 is connected to the signal output terminal 13. The collector of the transistor 56 is connected to the signal output terminal 14. The emitter of the transistor 51 is connected to the ground potential terminal through the current source 61, and is connected to the base of the transistor 55. The emitter of the transistor 52 is connected to the ground potential terminal through the current source 62, and is connected to the base of the transistor 56. The emitter of the transistor 55 is connected to the ground potential terminal through the current source 63. The emitter of the transistor 56 is connected to the ground potential terminal through the current source 64. The resistor 53 and the capacitor 54 are provided between the emitters of the transistors 55 and 56.

Figure 7:
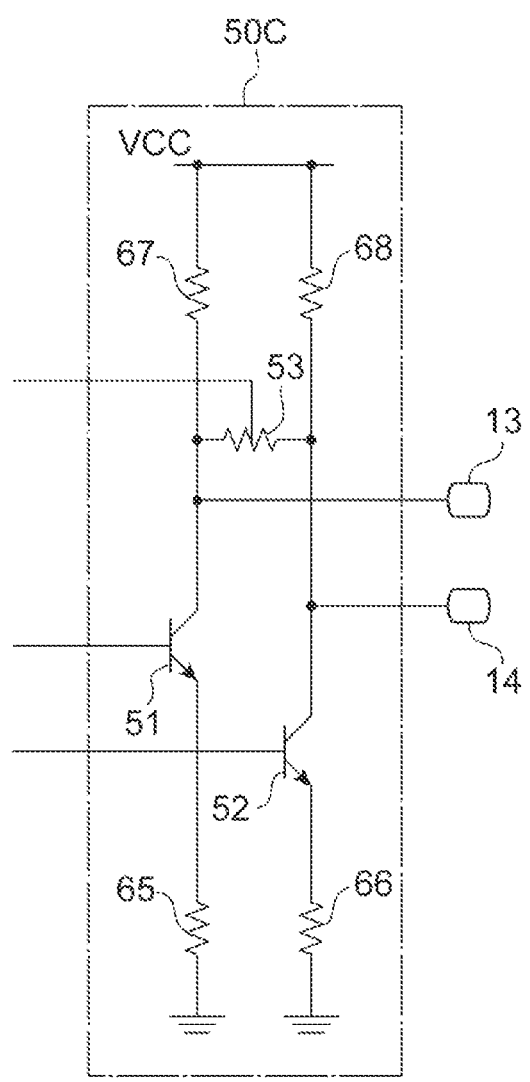
FIG. 7 is a diagram illustrating a third configuration example of the signal processing circuit 50.

FIG. 7 is a diagram illustrating a third configuration example of the signal processing circuit 50. The signal processing circuit 50C illustrated in the diagram includes resistors 65 to 68 in addition to the transistors 51 and 52 and the resistor 53. The transistors 51 and 52 are NPN bipolar transistors. The resistors 65 and 66 have the same resistance value. The resistors 67 and 68 have the same resistance value. The emitter of the transistor 51 is connected to the ground potential terminal through the resistor 65. The emitter of the transistor 52 is connected to the ground potential terminal through the resistor 66. The collector of the transistor 51 is connected to the power source potential terminal (VCC) through the resistor 67, and is connected to the signal output terminal 13. The collector of the transistor 52 is connected to the power source potential terminal (VCC) through the resistor 68, and is connected to the signal output terminal 14. The resistor 53 is provided between the collectors of the transistors 51 and 52.

Next, the simulation result will be described.

Figure 8:
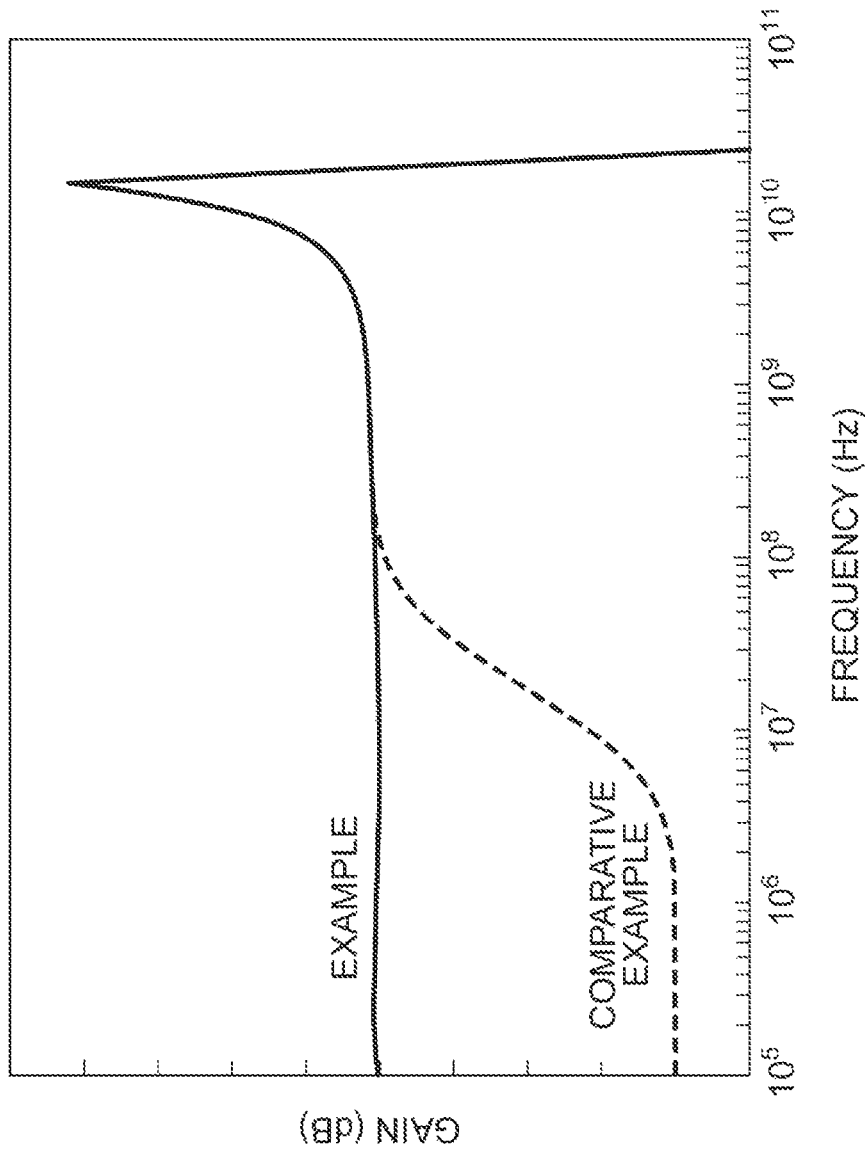
FIG. 8 is a graph showing the frequency dependence of gain for each of an example and a comparative example.

FIG. 8 is a graph showing the frequency dependence of gain for each of an example and a comparative example. Here, a configuration in which the signal processing circuit 50B (FIG. 6) is adopted as the signal processing circuit 50 in the linear amplifier 3 with feedback control (FIG. 3) is the example (EXAMPLE). A configuration in which the signal processing circuit 50B (FIG. 6) is adopted as the signal processing circuit 40 in the linear amplifier 2 without feedback control (FIG. 2) is the comparative example (COMPARATIVE EXAMPLE). Both the example and the comparative example are designed so that the gain can obtained in a band up to the frequency of 20 Gbps. The horizontal axis in this diagram is a frequency (FREQUENCY) (unit: Hz), and the vertical axis is the gain (GAIN) (unit: dB) of the output differential signals with respect to the input differential signals. As shown in this diagram, in the comparative example, the gain decreases in the band of 100 MHz ($1 \times 10^8$ (Hz)) or less, whereas in the example, a constant gain is obtained in a wide band. Thus, the linear amplifier of the present embodiment can have a constant gain over a wide band.

In the linear amplifier according to the example, an output signal having an approximately constant (reference value±5%) gain (dB) can be obtained in the frequency range of the input signal ($1 \times 10^5$ (Hz) to $3 \times 10^9$ (Hz)).

As described above, each of the linear amplifiers illustrated in FIGS. 5 and 7 includes: the first signal input terminal 11; the second signal input terminal 12; the first signal output terminal 13; the second signal output terminal 14; the first resistor 21 provided between the first signal input terminal 11 and the first reference potential terminal (for example, VCC); the second resistor 22 provided between the second signal input terminal 12 and the first reference potential terminal (for example, VCC); the first transistor 51 including a terminal connected to the first signal output terminal 13; the second transistor 52 including a terminal connected to the second signal output terminal 14; the third resistor 23 provided between the first signal input terminal 11 and the control terminal of the first transistor 51; the fourth resistor 24 provided between the second signal input terminal 12 and the control terminal of the second transistor 52; the first capacitor 25 provided in parallel with the third resistor 23; the second capacitor 26 provided in parallel with the fourth resistor 24; the third transistor 27 provided between the control terminal of the first transistor 51 and the second reference potential terminal (for example, ground potential); the fourth transistor 28 provided between the control terminal of the second transistor 52 and the second reference potential terminal (for example, ground potential); the common voltage output resistor 53 provided between the first signal output terminal 13 and the second signal output terminal 14; and the differential amplifier 29 including a first input terminal connected to the common voltage output resistor 53, a second input terminal (for example, VREF), and an output terminal connected to the control terminal of the third transistor 27 and the control terminal of the fourth transistor 28.

In the linear amplifier illustrated in FIG. 5, one end of the common voltage output resistor 53 is connected to the first signal output terminal 13 through the first transistor 51, and the one end is connected to the second reference potential terminal through the first current source 61. The other end of the common voltage output resistor 53 is connected to the second signal output terminal 14 through the second transistor 52, and the other end is connected to the second reference potential terminal through the second current source 62.

The linear amplifier illustrated in FIG. 7 includes the fifth resistor 65 connected to the second reference potential terminal (for example, ground potential), the sixth resistor 66 connected to the second reference potential terminal (for example, ground potential), the seventh resistor 67 connected to the first reference potential terminal (for example, power source potential VCC), and the eighth resistor 68 connected to the first reference potential terminal (for example, power source potential VCC). Here, the fifth resistor 65 is connected to one end of the common voltage output resistor 53 through the first transistor 51, the sixth resistor 66 is connected to the other end of the common voltage output resistor 53 through the second transistor 52, the seventh resistor 67 is connected to the one end of the common voltage output resistor 53, and the eighth resistor 68 is connected to the other end of the common voltage output resistor 53.

The linear amplifier illustrated in FIG. 6 described above includes the fifth transistor 55 and the sixth transistor 56 in addition to the first transistor 51 and the second transistor 52. The fifth transistor 55 includes a control terminal connected to one end of the first transistor 51 and a terminal connected to the first signal output terminal 13, and the sixth transistor 56 includes a control terminal connected to one end of the second transistor 52 and a terminal connected to the second signal output terminal 14.

The linear amplifier illustrated in FIG. 6 further includes the capacitor 54 provided in parallel with the common voltage output resistor. One end of the common voltage output resistor 53 is connected to the first signal output terminal 13 through the fifth transistor 55, and the one end is connected to the second reference potential terminal (for example, ground potential) through the first current source 63. The other end of the common voltage output resistor 53 is connected to the second signal output terminal 14 through the sixth transistor 56, and the other end is connected to the second reference potential terminal (for example, ground potential) through the second current source 64.

In the linear amplifier described above, in the example of FIG. 3, a power source potential (VCC) is applied to the first reference potential terminal, and a ground potential is applied to the second reference potential terminal. In the example of FIG. 4, a ground potential is applied to the first reference potential terminal, and a power source potential (VCC) is applied to the second reference potential terminal.

In addition, the common voltage described above can be the common mode voltage of the differential signals described above, and therefore, can be the average voltage of the voltages between the ground potential and a pair of differential signal potentials.

What is claimed is:

1. A linear amplifier that outputs differential signals corresponding to differential signals input to a first signal input terminal and a second signal input terminal, comprising:
   a signal processing circuit including:
      a first transistor and a second transistor, each of which has a first terminal, a second terminal, and a control terminal, and
      a common voltage output part that, when differential signals are input to the control terminals of the first transistor and the second transistor, outputs a common voltage of the differential signals at a stage later than the first terminal or the second terminal of each of the first transistor and the second transistor;
a first resistor provided between the first signal input terminal and a first reference potential terminal;
a second resistor provided between the second signal input terminal and the first reference potential terminal;
a third resistor provided between the first signal input terminal and the control terminal of the first transistor;
a fourth resistor provided between the second signal input terminal and the control terminal of the second transistor;
a first capacitor provided in parallel with the third resistor;
a second capacitor provided in parallel with the fourth resistor;
a third transistor including:
a first terminal,
a second terminal, and
a control terminal,
the third transistor being provided between the control terminal of the first transistor and a second reference potential terminal through the first terminal and the second terminal of the third transistor, respectively;
a fourth transistor including:
a first terminal,
a second terminal, and
a control terminal,
the fourth transistor being provided between the control terminal of the second transistor and the second reference potential terminal through the first terminal and the second terminal of the fourth transistor, respectively; and
a differential amplifier that receives the common voltage and a reference voltage and applies a voltage corresponding to a voltage difference between the common voltage and the reference voltage to the control terminals of the third transistor and the fourth transistor.

2. A linear amplifier, comprising:
a first signal input terminal;
a second signal input terminal;
a first signal output terminal;
a second signal output terminal;
a first resistor provided between the first signal input terminal and a first reference potential terminal;
a second resistor provided between the second signal input terminal and the first reference potential terminal;
a first transistor including a terminal connected to the first signal output terminal;
a second transistor including a terminal connected to the second signal output terminal;
a third resistor provided between the first signal input terminal and a control terminal of the first transistor;
a fourth resistor provided between the second signal input terminal and a control terminal of the second transistor;
a first capacitor provided in parallel with the third resistor;
a second capacitor provided in parallel with the fourth resistor;
a third transistor provided between the control terminal of the first transistor and a second reference potential terminal;
a fourth transistor provided between the control terminal of the second transistor and the second reference potential terminal;
a common voltage output resistor provided between the first signal output terminal and the second signal output terminal; and a differential amplifier including a first input terminal connected to the common voltage output resistor, a second input terminal, and an output terminal connected to a control terminal of the third transistor and a control terminal of the fourth transistor.

3. The linear amplifier according to claim 2,
wherein a power source potential is applied to the first reference potential terminal, and
a ground potential is applied to the second reference potential terminal.

4. The linear amplifier according to claim 2,
wherein a ground potential is applied to the first reference potential terminal, and
a power source potential is applied to the second reference potential terminal.

5. The linear amplifier according to claim 2,
wherein one end of the common voltage output resistor is connected to the first signal output terminal through the first transistor, and the one end is connected to the second reference potential terminal through a first current source, and
the other end of the common voltage output resistor is connected to the first signal output terminal through the second transistor, and the other end is connected to the second reference potential terminal through a second current source.

6. The linear amplifier according to claim 2, further comprising:
a fifth resistor connected to the second reference potential terminal;
a sixth resistor connected to the second reference potential terminal;
a seventh resistor connected to the first reference potential terminal; and
an eighth resistor connected to the first reference potential terminal,
wherein the fifth resistor is connected to one end of the common voltage output resistor through the first transistor,
the sixth resistor is connected to the other end of the common voltage output resistor through the second transistor,
the seventh resistor is connected to the one end of the common voltage output resistor, and
the eighth resistor is connected to the other end of the common voltage output resistor.

7. A linear amplifier, comprising:
a first signal input terminal;
a second signal input terminal;
a first signal output terminal;
a second signal output terminal;
a first resistor provided between the first signal input terminal and a first reference potential terminal;
a second resistor provided between the second signal input terminal and the first reference potential terminal;
a first transistor;
a second transistor;
a third resistor provided between the first signal input terminal and a control terminal of the first transistor;
a fourth resistor provided between the second signal input terminal and a control terminal of the second transistor;
a first capacitor provided in parallel with the third resistor;
a second capacitor provided in parallel with the fourth resistor;
a third transistor provided between the control terminal of the first transistor and a second reference potential terminal;

a fourth transistor provided between the control terminal of the second transistor and the second reference potential terminal;

a common voltage output resistor provided between the first signal output terminal and the second signal output terminal;

a differential amplifier including a first input terminal connected to the common voltage output resistor, a second input terminal, and an output terminal connected to a control terminal of the third transistor and a control terminal of the fourth transistor;

a fifth transistor including a control terminal connected to one end of the first transistor and a terminal connected to the first signal output terminal; and a sixth transistor including a control terminal connected to one end of the second transistor and a terminal connected to the second signal output terminal.

8. The linear amplifier according to claim 7, further comprising:

a capacitor provided in parallel with the common voltage output resistor, wherein one end of the common voltage output resistor is connected to the first signal output terminal through the fifth transistor, and the one end is connected to the second reference potential terminal through a first current source, and the other end of the common voltage output resistor is connected to the second signal output terminal through the sixth transistor, and the other end is connected to the second reference potential terminal through a second current source.

9. The linear amplifier according to claim 7, wherein a power source potential is applied to the first reference potential terminal, and a ground potential is applied to the second reference potential terminal.

10. The linear amplifier according to claim 7, wherein a ground potential is applied to the first reference potential terminal, and a power source potential is applied to the second reference potential terminal.

* * * * *